(12) United States Patent
Wang et al.

(10) Patent No.: US 12,238,952 B2
(45) Date of Patent: Feb. 25, 2025

(54) LIGHT EMITTING DIODE, METHOD OF MANUFACTURING THE SAME, AND LIGHT EMITTING DEVICE

(71) Applicant: BOE TECHNOLOGY GROUP CO., LTD., Beijing (CN)

(72) Inventors: Linlin Wang, Beijing (CN); Juanjuan You, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 576 days.

(21) Appl. No.: 17/279,664

(22) PCT Filed: Jul. 8, 2020

(86) PCT No.: PCT/CN2020/100785
§ 371 (c)(1),
(2) Date: Mar. 25, 2021

(87) PCT Pub. No.: WO2021/004469
PCT Pub. Date: Jan. 14, 2021

(65) Prior Publication Data
US 2022/0037614 A1 Feb. 3, 2022

(30) Foreign Application Priority Data

Jul. 11, 2019 (CN) .......................... 201910625633.4

(51) Int. Cl.
*H10K 50/824* (2023.01)
*H10K 50/13* (2023.01)
(Continued)

(52) U.S. Cl.
CPC ......... *H10K 50/824* (2023.02); *H10K 50/131* (2023.02); *H10K 50/844* (2023.02);
(Continued)

(58) Field of Classification Search
CPC ............. H10K 50/8445; H10K 50/828; H10K 50/816; H10K 50/826
See application file for complete search history.

(56) References Cited

U.S. PATENT DOCUMENTS

| 5,969,474 A | 10/1999 | Arai | |
|---|---|---|---|
| 2007/0001586 A1* | 1/2007 | Ryu | H10K 50/828 |
| | | | 313/506 |

(Continued)

FOREIGN PATENT DOCUMENTS

| CN | 101128074 A | 2/2008 |
|---|---|---|
| CN | 101562237 A | 10/2009 |

(Continued)

OTHER PUBLICATIONS

China Patent Office, CN201910625633.4 First Office Action issued on Jan. 29, 2021.

*Primary Examiner* — Evren Seven
(74) *Attorney, Agent, or Firm* — HOUTTEMAN LAW LLC

(57) ABSTRACT

The present disclosure provides a light-emitting diode, including a first electrode, a light-emitting functional layer and a second electrode which are stacked, the first electrode is a transparent electrode, the second electrode includes a metal electrode layer and a semiconductor auxiliary layer, the metal electrode layer is attached to the light-emitting functional layer, the semiconductor auxiliary layer is located on a surface of the metal electrode layer away from the light-emitting functional layer. The metal electrode layer is made of a magnesium-silver alloy, a thickness of the metal electrode layer is between 3 nm and 5 nm, and the semiconductor auxiliary layer is made of IZO, a thickness of the semiconductor auxiliary layer is between 100 nm and 130 nm. The present disclosure further provides a light emitting device and a method of manufacturing a light emitting (Continued)

diode. The light-emitting diode has high color rendering index and low power consumption.

16 Claims, 2 Drawing Sheets

(51) Int. Cl.
    *H10K 50/844* (2023.01)
    *H10K 71/00* (2023.01)
    *H10K 102/00* (2023.01)

(52) U.S. Cl.
    CPC ......... *H10K 71/00* (2023.02); *H10K 2102/00* (2023.02); *H10K 2102/351* (2023.02)

(56) References Cited

U.S. PATENT DOCUMENTS

| | | | |
|---|---|---|---|
| 2012/0056208 A1* | 3/2012 | Nishikawa | H10K 50/828 257/E51.018 |
| 2013/0217168 A1* | 8/2013 | Hartmann | H10K 50/844 216/18 |
| 2014/0024180 A1* | 1/2014 | Choi | H10K 77/10 438/778 |
| 2017/0186821 A1* | 6/2017 | Yoo | H10K 59/32 |
| 2018/0301661 A1* | 10/2018 | Schicktanz | B32B 27/322 |
| 2018/0331328 A1* | 11/2018 | Won | H10K 71/00 |

FOREIGN PATENT DOCUMENTS

| | | |
|---|---|---|
| CN | 102386340 A | 3/2012 |
| CN | 102690235 A | 9/2012 |
| CN | 102769104 A | 11/2012 |
| CN | 102983284 A | 3/2013 |
| CN | 103460804 A | 12/2013 |
| CN | 104835919 A | 8/2015 |
| CN | 106920816 A | 7/2017 |
| CN | 107452888 A | 12/2017 |
| CN | 110323358 A | 10/2019 |
| WO | WO 2014092439 A1 | 6/2014 |

* cited by examiner

LIGHT EMITTING DIODE, METHOD OF MANUFACTURING THE SAME, AND LIGHT EMITTING DEVICE

CROSS REFERENCE TO RELATED APPLICATIONS

The present application claims priority to Chinese patent application No. 201910625633.4 filed at Chinese Intellectual Property Office on Jul. 11, 2019, the disclosure of which is incorporated herein by reference in its entirety.

TECHNICAL FIELD

The present disclosure relates to the field of lighting devices, and in particular, to a light emitting diode, a light emitting device including the light emitting diode, and a method of manufacturing the light emitting diode.

BACKGROUND

Unlike display devices, important parameters of organic light emitting diode products used for illumination include color temperature, power, efficiency, color rendering index, and the like. In order to protect the human eyes, the color temperature should generally be between 2500K and 4000K, and the required light should include weak blue light and strong red light.

SUMMARY

An embodiment of the present disclosure provides a light emitting diode, including a first electrode, a light-emitting functional layer and a second electrode which are stacked, the first electrode is a transparent electrode, where
the second electrode includes a metal electrode layer and a semiconductor auxiliary layer, the metal electrode layer is attached to the light-emitting functional layer, the semiconductor auxiliary layer is located on a surface, away from the light-emitting functional layer, of the metal electrode layer,
the metal electrode layer is made of a magnesium-silver alloy, a thickness of the metal electrode layer is between 3 nm and 5 nm, and
the semiconductor auxiliary layer is made of indium-zinc oxide (IZO), and a thickness of the semiconductor auxiliary layer is between 100 nm and 130 nm.

In some implementations, in the magnesium-silver alloy, a mass percentage of magnesium is between 70% and 90%.

In some implementations, the second electrode has a light transmittance ranging from 65% to 70% for light having a wavelength of 400 nm to 500 nm.

In some implementations, the light-emitting functional layer includes a first hole injection layer, a first hole transport layer, a red light-emitting functional layer, a green light-emitting functional layer, a first electron transport layer, a connecting layer, a second hole injection layer, a second hole transport layer, a blue light-emitting functional layer, and a second electron transport layer, which are stacked, and where the second electrode is located on a surface of the second electron transport layer away from the blue light-emitting functional layer.

In some implementations, a peak wavelength of green light emitted by the light emitting diode is between 530 nm and 540 nm, a peak wavelength of blue light emitted by the light emitting diode is between 465 nm and 475 nm, and a full width at half maximum of the blue light is between 69 nm and 79 nm.

In some implementations, the light-emitting diode further includes an encapsulation layer located on a side of the second electrode away from the light-emitting functional layer.

In some implementations, the encapsulation layer includes a first encapsulation layer and a second encapsulation layer, the first encapsulation layer is attached to the second electrode, and the second encapsulation layer is located on a side of the first encapsulation layer away from the light-emitting functional layer.

In some implementations, the first encapsulation layer is made of tetrafluoroethylene and the second encapsulation layer is made of silicon nitride.

An embodiment of the present disclosure provides a light emitting device, including the light emitting diode described above.

An embodiment of the present disclosure provides a method of manufacturing a light emitting diode, including:
forming a first electrode made of a transparent material;
forming a light-emitting functional layer on a surface of the first electrode;
forming a second electrode on a surface of the light-emitting functional layer away from the first electrode, where the second electrode includes a metal electrode layer and a semiconductor auxiliary layer, and the forming the second electrode includes:
forming the metal electrode layer on the light-emitting functional layer, where the metal electrode layer is made of magnesium-silver alloy, and a thickness of the metal electrode layer is between 3 nm and 5 nm; and
forming the semiconductor auxiliary layer on a surface of the metal electrode layer away from the light-emitting functional layer, the semiconductor auxiliary layer is made of IZO, the semiconductor auxiliary layer has a thickness between 100 nm and 130 nm.

In some implementations, the forming the light-emitting functional layer on the surface of the first electrode includes:
forming a first hole injection layer on the surface of the first electrode;
forming a first hole transport layer on a surface of the first hole injection layer away from the first electrode;
forming a red light-emitting functional layer on a surface of the first hole transport layer away from the first electrode;
forming a green light-emitting functional layer on a surface of the red light-emitting functional layer away from the first electrode;
forming a first electron transport layer on a surface of the green light-emitting functional layer away from the first electrode;
forming a connecting layer on a surface of the first electron transport layer away from the first electrode;
forming a second hole injection layer on a surface of the connecting layer away from the first electrode;
forming a second hole transport layer on a surface of the second hole injection layer away from the first electrode;
forming a blue light-emitting functional layer on a surface of the second hole transport layer away from the first electrode;
forming a second electron transport layer on a surface of the blue light-emitting functional layer away from the first electrode, and where, the second electrode layer is formed on a surface of the second electron transport layer away from the first electrode.

In some implementations, the method further includes:
forming an encapsulation layer on a surface of the second electrode away from the first electrode.

In some implementations, the encapsulation layer includes a first encapsulation layer and a second encapsulation layer, and the forming the encapsulation layer on the surface of the second electrode away from the first electrode further includes:
forming the first encapsulation layer on the surface of the second electrode away from the first electrode using tetrafluoroethylene; and
forming the second encapsulation layer on a surface of the first encapsulation layer away from the second electrode using silicon nitride.

DESCRIPTION OF DRAWINGS

The accompanying drawings, which are included to provide a further understanding of the present disclosure and are incorporated in and constitute a part of this specification, and together with embodiments below serve to explain the present disclosure, but do not constitute a limitation of the present disclosure. In the drawings.

DESCRIPTION OF EMBODIMENTS

The specific embodiments of the present disclosure are described in detail below in combination with the accompanying drawings. It should be understood that the specific embodiments described herein are only used to illustrate and explain the present disclosure and are not used to limit the present disclosure.

Figure 1:
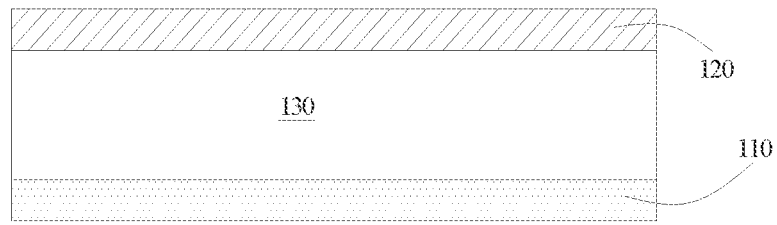
FIG. 1 is a schematic diagram of a light emitting diode in the related art.

In the related art, a method of manufacturing the light emitting diode shown in FIG. 1 includes:
providing a base substrate (not shown in the drawings);
depositing an indium tin oxide (ITO) material layer having a thickness of 700 angstrom on a surface of the base substrate to form a first electrode layer 110;
forming, by evaporation, a first hole injection layer 131 on a surface, away from the base substrate, of the first electrode layer 110;
forming, by evaporation, a first hole transport layer 132 on a surface, away from the base substrate, of the first hole injection layer 131, where a total thickness of the first hole injection layer 131 and the first hole transport layer 132 is 650 angstroms;
forming, by evaporation, a red light-emitting functional layer 133 on a surface, away from the base substrate, of the first hole transport layer 132;
forming, by evaporation, a green light-emitting functional layer 134 on a surface, away from the bae substrate, of the red light-emitting functional layer 133, where a thickness of each of the red light-emitting functional layer 133 and the green light-emitting functional layer 134 is 300 angstroms;
forming, by evaporation, a first electron transport layer 135 with a thickness of 200 angstroms on a surface, away from the base substrate, of the green light-emitting functional layer 134;
forming, by evaporation, a connecting layer 136 with a thickness of 150 angstroms on a surface, away from the substrate, of the first electron transport layer 135;
forming, by evaporation, a second hole injection layer 137 on a surface, away from the base substrate, of the connecting layer 136;
forming, by evaporation, a second hole transport layer 138 on a surface, away from the base substrate, of the second hole injection layer 137, where a total thickness of the second hole injection layer 137 and the second hole transport layer 138 is 990 angstroms;
forming, by evaporation, a blue light-emitting functional layer 139 with a thickness of 250 angstroms on a surface, away from the base substrate, of the second hole transport layer 138;
forming, by evaporation, a second electron transmission layer 1310 with a thickness of 250 angstroms on a surface, away from the base substrate, of the blue light-emitting functional layer 139;
forming, by sputtering, a second electrode 120 with a thickness of 1500 angstroms on a surface, away from the base substrate, of the second electron transport layer 1310 by using metal aluminum as a target material;
forming, by chemical vapor deposition, a silicon nitride with a thickness of 1 μm on a surface, away from the base substrate, of the second electrode 120 to form an encapsulation layer 140.

For the light emitting diode in the related art, in order to ensure that the organic light emitting diode has a relative high color rendering index, the light emitting spectrum of the light emitting diode needs to be as wide as possible, and therefore, the light emitting diode with a weak microcavity structure is often used in the field of lighting devices, so that the light emitting efficiency of the light emitting diode is reduced, and the power consumption is increased.

Therefore, how to reduce the power consumption of the light emitting diode while ensuring that the light emitting diode has a relative high color rendering index becomes an urgent technical problem to be solved in the field.

Figure 2:
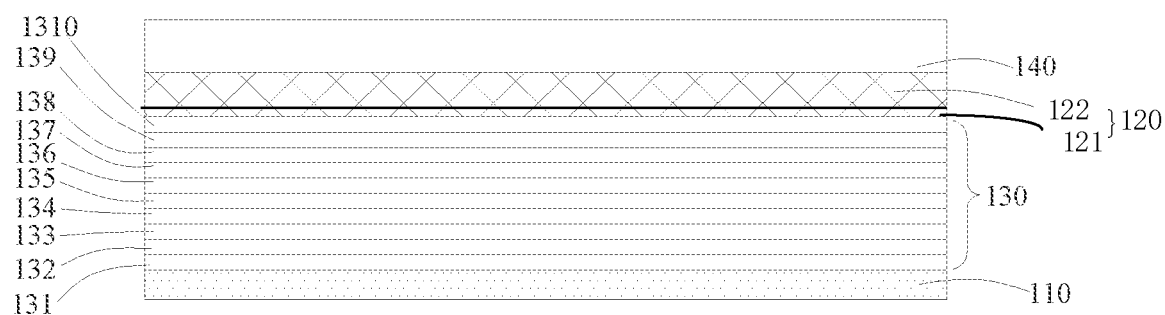
FIG. 2 is a schematic diagram of a light emitting diode in an embodiment according to the present disclosure.

An embodiment of the present disclosure provides a light emitting diode, as shown in FIG. 2, including a first electrode 110, a light-emitting functional layer 130, and a second electrode 120, which are stacked, where the first electrode 110 is a transparent electrode, and a light transmittance of the second electrode 120 ranges from 65% to 70% for light having a wavelength of 400 nm to 500 nm. It can be seen that a reflectivity of the second electrode 120 for light having the wavelength of 400 nm to 500 nm is between 30% and 35%.

Note that, the light transmittance of the second electrode 120 for blue light may be defined to be between 65% and 70%.

In the present disclosure, the specific structure of the second electrode 120 is not particularly limited. In an implementation, as shown in FIG. 2, the second electrode 120 includes a metal electrode layer 121 and a semiconductor auxiliary layer 122. The metal electrode layer 121 is attached to the light-emitting functional layer 130, and the semiconductor auxiliary layer 122 is disposed on a surface of the metal electrode layer 121 facing away from the light-emitting functional layer 130.

Note that, the metal electrode layer 121 should have a small thickness so that the metal electrode layer 121 has a light transmittance. The second electrode 120 having "a light transmittance between 65% and 70% for light having a wavelength of 400 nm to 500 nm" can be obtained by adjusting the thicknesses of the metal electrode layer 121 and the semiconductor auxiliary layer 122. In some implementations, the thickness of the metal electrode layer 121 is between 3 nm and 5 nm.

The light emitting diode provided by the present disclosure is a top emission diode, the first electrode 110 is an anode of the light emitting diode, and the second electrode 120 is a cathode of the light emitting diode. The second electrode 120 of the light emitting diode has both transmission and reflection properties, so that when the light emitting diode emits light, the second electrode 120 can enhance an intensity of a microcavity formed in the light emitting diode, but does not enhance a weak microcavity to a strong microcavity, and thus when the light emitting diode emits light, a high color rendering index, a wide spectrum and a high light emitting efficiency can be obtained, thereby the power consumption of the light emitting diode is reduced.

In the present disclosure, the metal electrode layer 121 is made of a metal material, and the semiconductor auxiliary layer 122 is made of a semiconductor material. The main function of the metal electrode layer 121 is to conduct electricity and form an electrode, and the metal electrode layer 121 can also provide better light reflection performance. The main function of the semiconductor auxiliary layer 122 is to adjust the transmittance of the second electrode 120, and the semiconductor auxiliary layer 122 is made of a transparent semiconductor material (e.g., indium zinc oxide (IZO)).

In some implementations, the metal electrode layer 121 is made of a magnesium-silver alloy, and the semiconductor auxiliary layer 122 is made of indium zinc oxide.

In order to make the metal electrode layer 121 have both good reflectivity and good conductivity, in some implementations, the magnesium is 70% to 90% by mass of the magnesium-silver alloy forming the metal electrode layer 121. When the metal electrode layer 121 is manufactured, the metal electrode layer 121 may be obtained by magnetron sputtering using the magnesium-silver alloy as a target material.

In some implementations, a thickness of the semiconductor auxiliary layer 122 is between 100 nm and 130 nm.

In the present disclosure, there is no particular requirement on the color of the light emitted from the light emitting diode. The material of the light-emitting functional layer 130 may be determined according to a specific desired color of light to be emitted. For example, the light emitting diode may emit white light. Accordingly, the light-emitting functional layer 130 includes a first hole injection layer 131, a first hole transport layer 132, a red light-emitting functional layer 133, a green light-emitting functional layer 134, a first electron transport layer 135, a connecting layer 136, a second hole injection layer 137, a second hole transport layer 138, a blue light-emitting functional layer 139, and a second electron transport layer 1310, which are stacked.

The first hole injection layer 131 is disposed on the first electrode 110, and the second electrode 120 is disposed on a surface of the second electron transport layer 1310 facing away from the blue light-emitting functional layer 139.

In the light emitting diode provided by the present disclosure, the green light-emitting functional layer 134 is formed directly after the red light-emitting functional layer 133 is formed, then the connecting layer is formed, and the blue light-emitting functional layer is formed on the connecting layer. A peak value of green light in the light emitted by the light emitting diode is 520 nm to 535 nm, a peak value of blue light in the light emitted by the light emitting diode is 465 nm to 475 nm, and a full width at half maximum of the blue light is 69 nm to 79 nm.

The connecting layer 136 allows both electrons and holes to pass therethrough, and thus, the connecting layer 136 may be made of an aluminum nitride material.

Figure 3:
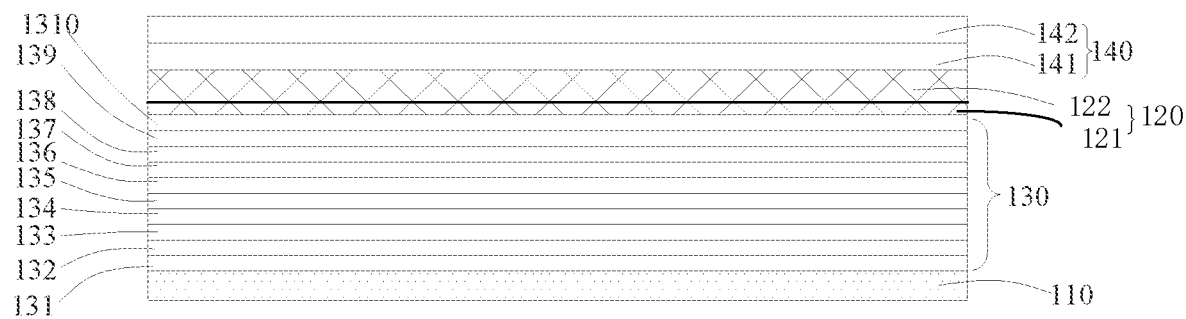
FIG. 3 is a schematic diagram of a light emitting diode in an embodiment according to the present disclosure.

After the second electrode layer 120 is formed, as shown in FIGS. 2 and 3, an encapsulation layer 140 is used to perform encapsulation.

In the present disclosure, a specific structure of the encapsulation layer 140 is not particularly limited, as long as the light-emitting functional layer of the light emitting diode can be isolated from outside to prevent the light-emitting functional layer from being corroded by external water and oxygen. In some implementations, as shown in FIG. 3, the encapsulation layer 140 includes a first encapsulation layer 141 made of tetrafluoroethylene and a second encapsulation layer 142 made of silicon nitride, the first encapsulation layer 141 is attached to the second electrode 120, and the second encapsulation layer 142 is located on a side of the first encapsulation layer 141 facing away from the light-emitting functional layer 130.

The first encapsulation layer 141 made of tetrafluoroethylene has a certain light reflecting performance, so that a weak microcavity of the light emitting diode can be enhanced to a certain extent, and the light emitting efficiency is improved.

An embodiment of the present disclosure provides a light emitting device including the above light emitting diode provided by the present disclosure.

As described above, the light emitting diode has a relative high color rendering index and a relative high light emitting efficiency. In the present disclosure, a specific application of the light emitting device is not particularly limited, and for example, the light emitting device may be a lighting device. Certainly, the present disclosure is not limited thereto, and the light emitting device may also be a backlight of a display apparatus.

Figure 5:
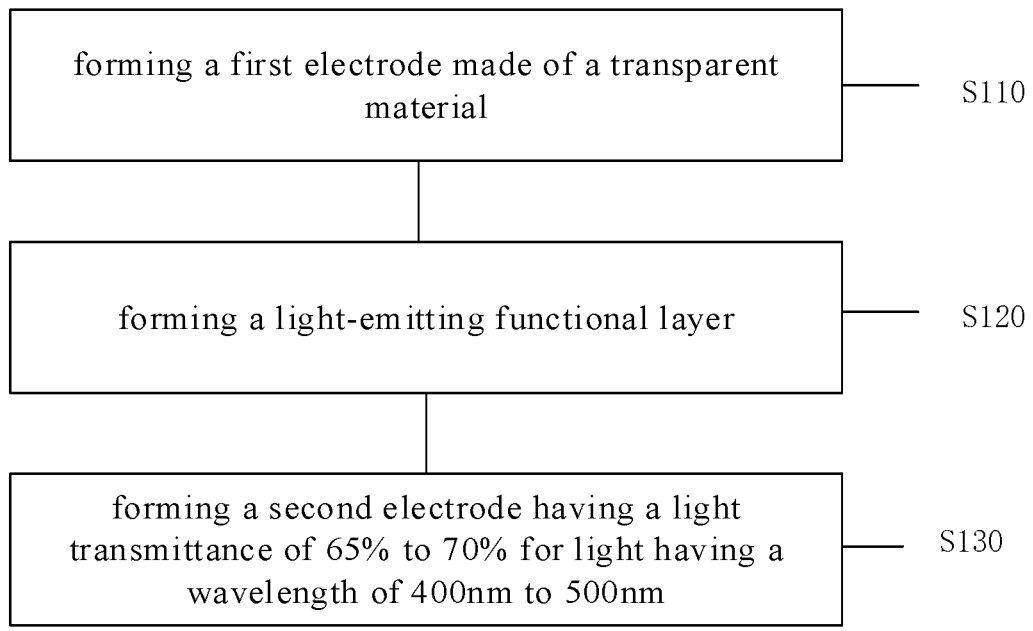
FIG. 5 is a flow chart of a method of manufacturing a light emitting diode according to an embodiment of the present disclosure.

An embodiment of the present disclosure provides a method of manufacturing a light emitting diode, as shown in FIG. 5, including steps S110 to S130.

In step S110, a first electrode made of a transparent material is formed.

In step S120, a light-emitting functional layer is formed on a surface of the first electrode.

In step S130, a second electrode having a light transmittance ranging from 65% to 70% for light having a wavelength of 400 nm to 500 nm is formed on a surface of the light-emitting functional layer away from the first electrode, where, the step of forming the second electrode on the surface of the light-emitting functional layer away from the first electrode includes:

forming a metal electrode layer on the surface of the light-emitting functional layer away from the first electrode, where the metal electrode layer is made of magnesium-silver alloy, and a thickness of the metal electrode layer is between 3 nm and 5 nm; and forming a semiconductor auxiliary layer on a surface of the metal electrode layer away from the first electrode.

As described above, the light emitting diode is a top emission type light emitting diode, since the second electrode is both reflective and transmissive, when the light emitting diode emits light, the weak resonant microcavity formed in the light emitting diode is enhanced but is not enhanced to a strong microcavity, and thus, a high light emitting efficiency can be achieved while ensuring a high color rendering index, and thus the power consumption is low.

In some implementations, the semiconductor auxiliary layer is made of IZO.

In the present disclosure, the metal electrode layer may be formed by sputtering, and similarly, the semiconductor auxiliary layer may be formed by sputtering.

In order to ensure that the metal electrode layer has better conductive performance and proper light reflection performance, and reduce the cost of the light emitting diode, in some implementations, the magnesium-silver alloy has magnesium in a mass percentage of 70% to 90%.

To ensure that the second electrode is light transmissive, in some implementations, the metal electrode layer has a thickness between 3 nm and 5 nm.

In some implementations, the semiconductor auxiliary layer has a thickness between 100 nm and 130 nm.

In some implementations, the light emitting diode is a white light emitting diode, and accordingly, the step of forming the light-emitting functional layer on the surface of the first electrode includes:
  forming a first hole injection layer on a surface of the first electrode;
  forming a first hole transport layer on a surface of the first hole injection layer away from the first electrode;
  forming a red light-emitting functional layer on a surface of the first hole transport layer away from the first electrode;
  forming a green light-emitting functional layer on a surface of the red light-emitting functional layer away from the first electrode;
  forming a first electron transport layer on a surface of the green light-emitting functional layer away from the first electrode;
  forming a connecting layer on a surface of the first electron transport layer away from the first electrode;
  forming a second hole injection layer on a surface of the connecting layer away from the first electrode;
  forming a second hole transport layer on a surface of the second hole injection layer away from the first electrode;
  forming a blue light-emitting functional layer on a surface of the second hole transport layer away from the first electrode; and
  forming a second electron transport layer on a surface of the blue light-emitting functional layer away from the first electrode.

In the present disclosure, each layer in the light-emitting functional layer may be formed by evaporation. In the present disclosure, the green light-emitting functional layer is formed directly after the red light-emitting functional layer is formed, and the red light-emitting functional layer and the green light-emitting functional layer are formed as a co-evaporation layer.

In order to prevent water and oxygen from corroding the light-emitting functional layer, in some implementations, the method further includes: after forming the second electrode, forming an encapsulation layer on a side of the second electrode away from the light-emitting functional layer.

In order to further enhance the weak microcavity, in some implementations, a first encapsulation layer with light reflection performance may be disposed on a side of the second electrode away from the light-emitting functional layer, and a second encapsulation layer is formed by using an inorganic material, and specifically, after the second electrode is formed, the method further includes:
  forming the first encapsulation layer on a side of the second electrode away from the light-emitting functional layer by using tetrafluoroethylene; and
  forming the second encapsulation layer on a side of the first encapsulation layer away from the light-emitting functional layer by using silicon nitride.

An embodiment of the present disclosure provides a method of manufacturing a light emitting diode as shown in FIG. 2 (example 1), including:
  providing a base substrate (not shown in the drawings);
  depositing an ITO (indium tin oxide) material layer with a thickness of 120 angstroms as the first electrode 110 on a surface of the base substrate;
  forming the first hole injection layer 131 on the surface of the first electrode 110 away from the base substrate by evaporation, and the material of the first hole injection layer 131 is PEDOT (poly 3, 4-ethylenedioxythiophene);
  forming the first hole transport layer 132 on the surface of the first hole injection layer 131 away from the base substrate by evaporation, the material of the first hole transport layer is NPB, and a total thickness of the first hole injection layer 131 and the first hole transport layer 132 is 450 angstroms; forming the red light-emitting functional layer 133 on the surface of the first hole transport layer 132 away from the base substrate by evaporation, and the material of the red light-emitting functional layer is Btp2Ir (acac);
  forming the green light-emitting functional layer 134 on the surface of the red light-emitting functional layer 133 away from the base substrate by evaporation, and the material of the green light-emitting functional layer is Ir(ppy)$_3$, where the thicknesses of each of the red light-emitting functional layer 133 and the green light-emitting functional layer 134 is 300 angstroms;
  forming the first electron transport layer 135 with a thickness of 200 angstroms on the surface of the green light-emitting functional layer 134 away from the base substrate by evaporation, and the material of the first electron transport layer is TPBi;
  forming the connecting layer 136 with a thickness of 150 angstroms on the surface of the first electron transport layer 135 away from the base substrate by evaporation, where the connecting layer is made of aluminum nitride;
  forming the second hole injection layer 137 on the surface of the connecting layer 136 away from the base substrate by evaporation, where the material of the second hole injection layer is PEDOT;
  forming the second hole transport layer 138 on the surface of the second hole injection layer 137 away from the base substrate by evaporation, the material of the second hole transport layer is NPB, and a total thickness of the second hole injection layer 137 and the second hole transport layer 138 is 1150 angstroms;
  forming the blue light-emitting functional layer 139 with a thickness of 250 angstroms on the surface of the hole transport layer 138 away from the base substrate by evaporation, and the material of the blue light-emitting functional layer is MADN;
  forming the second electron transport layer 1310 with a thickness of 550 angstroms on the surface of the blue light-emitting functional layer 139 away from the base substrate by evaporation, and the material of the second electron transport layer is TPBi;

forming the metal electrode layer 121 with a thickness of 40 angstroms on the surface of the second electron transport layer away from the base substrate by sputtering using the magnesium-silver alloy as a target material;

forming the semiconductor auxiliary layer 122 with a thickness of 1000 angstroms on the surface of the metal electrode layer away from the base substrate by sputtering using IZO as a target material, thereby obtaining the second electrode 120 including the metal electrode layer and the semiconductor auxiliary layer; and forming a silicon nitride layer with a thickness of 1 μm on the surface of the semiconductor auxiliary layer 122 away from the base substrate by chemical vapor deposition to form the encapsulation layer 140.

An embodiment of the present disclosure provides a method of manufacturing the light emitting diode shown in FIG. 3 (example 2) which is different from the above-described method of manufacturing the light emitting diode shown in FIG. 2 only in the step of forming the encapsulation layer. Only this difference will be described below. Specifically, the step of forming the encapsulation layer in this embodiment specifically includes:

forming a tetrafluoroethylene layer on the surface of the semiconductor auxiliary layer 122 away from the base substrate by coating to obtain a first encapsulation layer 141 with a thickness of 1 μm;

forming a silicon nitride layer on the surface of the first encapsulation layer 141 away from the base substrate by chemical vapor deposition to form a second encapsulation layer 142 having a thickness of 1 μm, where the first encapsulation layer 141 and the second encapsulation layer 142 together form the encapsulation layer 140.

Figure 4:
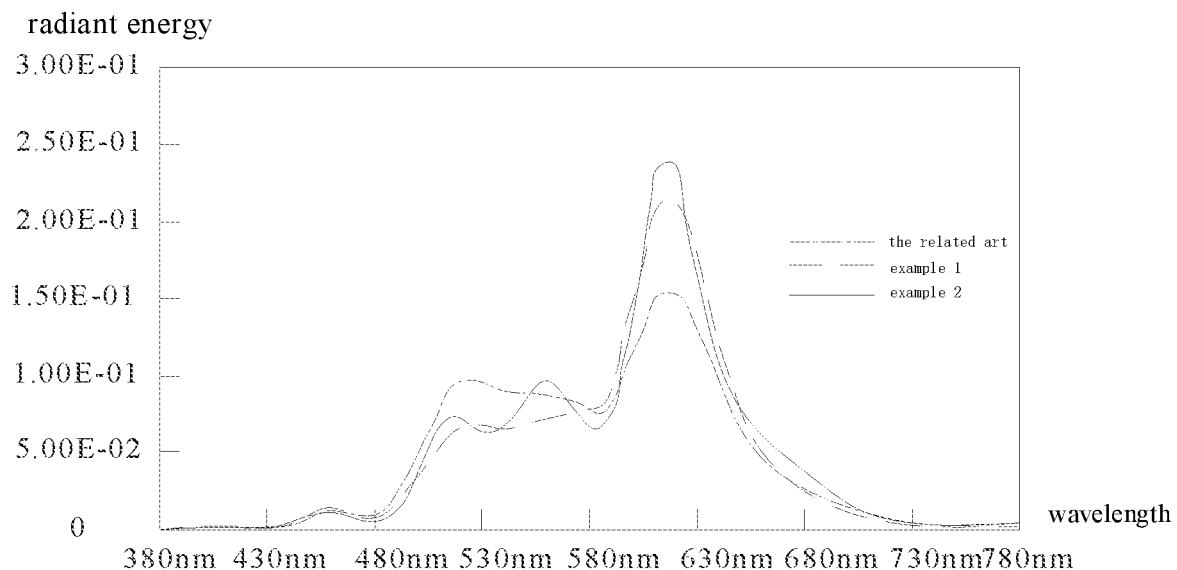
FIG. 4 is a spectrum diagram of the light emitting diode shown in FIG. 1, the light emitting diode shown in FIG. 2, and the light emitting diode shown in FIG. 3 when emitting light.

The spectrum of the light emitting diodes in the example 1, the example 2, and the related art are each measured at a current density of 10 using an IVL test apparatus, resulting in the spectrum chart shown in FIG. 4.

In light emitted by the light emitting diode obtained in example 2, a peak wavelength of green light is 520 nm to 535 nm, a peak wavelength of blue light is 465 nm to 475 nm, and a full width at half maximum of blue light is 69 nm to 79 nm.

As can be seen from FIG. 4, the radiant energy of the light emitting diode obtained in example 2 is the highest, and the radiant energy of the light emitting diode obtained in the related art is the lowest.

It was found from test by the CRI test equipment that, under a condition that the efficiency is 65 cd/a at 10J, the color rendering index of the light emitting device in the related art is 85, while the color rendering index of the light emitting device in example 2 is up to 91.

It will be understood that the above implementations are merely exemplary implementations employed to illustrate principles of the present disclosure, and the present disclosure is not limited thereto. It will be apparent to those ordinary skilled in the art that various changes and modifications can be made therein without departing from the spirit and scope of the present disclosure, and these changes and modifications are to be considered within the scope of the present disclosure.

The invention claimed is:

1. A light emitting diode, comprising a first electrode, a light-emitting functional layer and a second electrode which are laminated, the first electrode is a transparent electrode, wherein the second electrode is consisted of a metal electrode layer and a semiconductor auxiliary layer, the metal electrode layer is attached to the light-emitting functional layer, the semiconductor auxiliary layer is located on a surface, away from the light-emitting functional layer, of the metal electrode layer, the metal electrode layer is made of a magnesium-silver alloy, a thickness of the metal electrode layer is between 3 nm and 5 nm, the semiconductor auxiliary layer is made of indium zinc oxide, and a thickness of the semiconductor auxiliary layer is between 100 nm and 130 nm, wherein the second electrode has a light transmittance ranging from 65% to 70% for light having a wavelength of 400 nm to 500 nm.

2. The light emitting diode of claim 1, wherein the light-emitting functional layer comprises a first hole injection layer, a first hole transport layer, a red light-emitting functional layer, a green light-emitting functional layer, a first electron transport layer, a connecting layer, a second hole injection layer, a second hole transport layer, a blue light-emitting functional layer, and a second electron transport layer, which are stacked, and wherein the second electrode is located on a surface of the second electron transport layer away from the blue light-emitting functional layer.

3. The light emitting diode of claim 2, wherein a peak wavelength of green light emitted by the light emitting diode is between 530 nm and 540 nm, a peak wavelength of blue light emitted by the light emitting diode is between 465 nm and 475 nm, and a full width at half maximum of the blue light is between 69 nm and 79 nm.

4. The light emitting diode of claim 1, further comprising an encapsulation layer located on a side of the second electrode away from the light-emitting functional layer.

5. The light-emitting diode of claim 4, wherein the encapsulation layer comprises a first encapsulation layer and a second encapsulation layer, the first encapsulation layer is attached to the second electrode, and the second encapsulation layer is located on a side of the first encapsulation layer away from the light-emitting functional layer.

6. The light emitting diode of claim 5, wherein the first encapsulation layer is made of tetrafluoroethylene and the second encapsulation layer is made of silicon nitride.

7. A light emitting device, comprising the light emitting diode of claim 1.

8. A method of manufacturing a light emitting diode, comprising:

forming a first electrode made of a transparent material;

forming a light-emitting functional layer on a surface of the first electrode;

forming a second electrode on a surface of the light-emitting functional layer away from the first electrode, wherein the second electrode is consisted of a metal electrode layer and a semiconductor auxiliary layer, and the forming the second electrode comprises:

forming the metal electrode layer on the light-emitting functional layer, wherein the metal electrode layer is made of magnesium-silver alloy, and a thickness of the metal electrode layer is between 3 nm and 5 nm; and forming the semiconductor auxiliary layer on a surface of the metal electrode layer away from the light-emitting functional layer, the semiconductor auxiliary layer is made of indium zinc oxide, and the semiconductor auxiliary layer has a thickness between 100 nm and 130 nm,
wherein the second electrode has a light transmittance ranging from 65% to 70% for light having a wavelength of 400 nm to 500 nm.

9. The method of claim 8, wherein the forming the light-emitting functional layer on the surface of the first electrode comprises:
forming a first hole injection layer on the surface of the first electrode;
forming a first hole transport layer on a surface of the first hole injection layer away from the first electrode;
forming a red light-emitting functional layer on a surface of the first hole transport layer away from the first electrode;
forming a green light-emitting functional layer on a surface of the red light-emitting functional layer away from the first electrode;
forming a first electron transport layer on a surface of the green light-emitting functional layer away from the first electrode;
forming a connecting layer on a surface of the first electron transport layer away from the first electrode;
forming a second hole injection layer on a surface of the connecting layer away from the first electrode;
forming a second hole transport layer on a surface of the second hole injection layer away from the first electrode;
forming a blue light-emitting functional layer on a surface of the second hole transport layer away from the first electrode;
forming a second electron transport layer on a surface of the blue light-emitting functional layer away from the first electrode, and wherein,
the second electrode layer is formed on a surface of the second electron transport layer away from the first electrode.

10. The method of claim 8, further comprising:
forming an encapsulation layer on a surface of the second electrode away from the first electrode.

11. The method of claim 10, wherein the encapsulation layer comprises a first encapsulation layer and a second encapsulation layer, and the forming the encapsulation layer on the surface of the second electrode away from the first electrode further comprises:
forming the first encapsulation layer on the surface of the second electrode away from the first electrode using tetrafluoroethylene; and
forming the second encapsulation layer on the surface of the first encapsulation layer away from the second electrode using silicon nitride.

12. The light-emitting diode of claim 1, wherein in the magnesium silver alloy, a mass percentage of magnesium is between 70% and 90%.

13. The light emitting diode of claim 12, wherein the light-emitting functional layer comprises a first hole injection layer, a first hole transport layer, a red light-emitting functional layer, a green light-emitting functional layer, a first electron transport layer, a connecting layer, a second hole injection layer, a second hole transport layer, a blue light-emitting functional layer, and a second electron transport layer, which are stacked, and wherein the second electrode is located on a surface of the second electron transport layer away from the blue light-emitting functional layer.

14. The method of claim 8, wherein in the magnesium-silver alloy, a mass percentage of magnesium is between 70% and 90%.

15. The method of claim 14, further comprising:
forming an encapsulation layer on a surface of the second electrode away from the first electrode.

16. The method of claim 14, wherein the forming the light-emitting functional layer on the surface of the first electrode comprises:
forming a first hole injection layer on the surface of the first electrode;
forming a first hole transport layer on a surface of the first hole injection layer away from the first electrode;
forming a red light-emitting functional layer on a surface of the first hole transport layer away from the first electrode;
forming a green light-emitting functional layer on a surface of the red light-emitting functional layer away from the first electrode;
forming a first electron transport layer on a surface of the green light-emitting functional layer away from the first electrode;
forming a connecting layer on a surface of the first electron transport layer away from the first electrode;
forming a second hole injection layer on a surface of the connecting layer away from the first electrode;
forming a second hole transport layer on a surface of the second hole injection layer away from the first electrode;
forming a blue light-emitting functional layer on a surface of the second hole transport layer away from the first electrode;
forming a second electron transport layer on a surface of the blue light-emitting functional layer away from the first electrode, and wherein, the second electrode layer is formed on a surface of the second electron transport layer away from the first electrode.

* * * * *